United States Patent [19]
Cutler

[11] Patent Number: 5,952,102
[45] Date of Patent: Sep. 14, 1999

[54] DIAMOND COATED WC AND WC-BASED COMPOSITES WITH HIGH APPARENT TOUGHNESS

[75] Inventor: Raymond A. Cutler, Bountiful, Utah

[73] Assignee: Ceramatec, Inc., Salt Lake City, Utah

[21] Appl. No.: 08/854,454

[22] Filed: May 12, 1997

Related U.S. Application Data

[60] Provisional application No. 60/017,290, May 13, 1996.

[51] Int. Cl.$^6$ .......................................... G32B 9/00
[52] U.S. Cl. ........................ 428/408; 428/323; 428/325; 428/332; 428/697; 428/698; 428/699
[58] Field of Search .................................. 428/332, 325, 428/323, 698, 408, 697, 699

[56] References Cited

U.S. PATENT DOCUMENTS

| | | | |
|---|---|---|---|
| 4,656,071 | 4/1987 | Virkar . | |
| 4,707,384 | 11/1987 | Schachner et al. | 428/408 |
| 4,828,584 | 5/1989 | Cutler . | |
| 4,990,403 | 2/1991 | Ito | 428/408 |
| 5,089,447 | 2/1992 | Timm et al. . | |
| 5,236,740 | 8/1993 | Peters et al. . | |
| 5,286,684 | 2/1994 | Otsuka et al. | 501/92 |
| 5,310,596 | 5/1994 | Bigelow et al. | 428/408 |
| 5,370,944 | 12/1994 | Omori et al. | 428/565 |
| 5,372,797 | 12/1994 | Dunmead et al. . | |
| 5,433,977 | 7/1995 | Sarin et al. | 423/446 |
| 5,435,815 | 7/1995 | Ikegaya et al. | 51/295 |
| 5,718,948 | 2/1998 | Ederyd et al. | 427/249 |

OTHER PUBLICATIONS

Almond, "Deformation Characteristics and Mechanical Properties of Hardmetals", *Science of Hard Materials*, pp. 517–557, 1983.

Chao et al., "Rolling–Contact Fatigue and Wear of CVD–SIC with Residual Surface Compression", *J. Am. Ceram. Soc.*, vol. 78, No. 9, pp. 2307–2313, Sep. 1995.

Cutler et al., "Strength Improvement in Transformation–Toughened Alumina by Selective Phase Transformation", *J. Am. Ceram. Soc.*, vol. 70, No. 10, pp. 714–718, Oct. 1987.

Drory et al., "Fracture Toughness of Chemically Vapor–Deposited Diamond", *J. Am. Ceram. Soc.*, vol. 74, No. 12, pp. 3148–3150, Dec. 1991.

Feldman et al., "Chemical Vapor Deposited Diamond", *Ceramic Films and Coatings*, pp. 413–437, 1993.

Hay, Robert A., "The New Diamond Technology and its Application in Cutting Tools", *Ceramic Cutting Tools*, pp. 305–327, 1994.

Lakshminarayanan et al., "Toughening of Layered Ceramic Composites with Residual Surface Compression", *J. Am. Ceram. Soc.*, vol. 79, No. 1, pp. 79–87, Jan. 1996.

Virkar et al., "Measurement of Residual Stresses in Oxide–ZrO$_2$ Three–Layer Composites", *J. Am. Ceram. Soc.*, vol. 71, No. 3, pp. C–148–C–151, Mar. 1988.

*Primary Examiner*—Archene Turner
*Attorney, Agent, or Firm*—Trask, Britt & Rossa

[57] ABSTRACT

A binderless coarse-grained WC substrate is coated with a chemical vapor deposition ("CVD") diamond layer in order to give a coating with improved adherence relative to WC—Co-based substrates and high compressive residual stress relative to Si$_3$N$_4$-based substrates. The elimination of Co from the WC improves the adherence of the diamond coating, allowing thicker coatings to be produced than for WC—Co substrates. Thin coatings (<30 μm) are acceptable for applications where the coating is under low applied stress. Thicker coatings (>30 μm) are used to give enhanced damage resistance for stresses localized at the surface of the diamond-coated component. Applying the diamond coating to a WC/WC—Al$_2$O$_3$/WC graded composite allows materials with high damage resistance to be fabricated. Deposition of a substantially continuous diamond film may be accomplished by CVD and PVD techniques. WC ceramics allow faster deposition rates since Co in WC—Co enhances back-conversion of diamond to graphite, and diamond can therefore be deposited on WC at higher temperatures than WC—Co substrates.

19 Claims, 2 Drawing Sheets

DIAMOND COATED WC AND WC-BASED COMPOSITES WITH HIGH APPARENT TOUGHNESS

PRIORITY CLAIM

Under the provisions of 35 U.S.C. §1.19(e), priority is claimed from Provisional patent application Ser. No. 60/017,290 filed May 13, 1996.

TECHNICAL FIELD

The present invention relates to hard coatings for tools. More particularly, the present invention relates to diamond-coated binderless tungsten carbide ("WC") ceramics and methods for making diamond-coated WC or WC-based ceramics with high apparent fracture toughness.

BACKGROUND

Chemical vapor deposition ("CVD") has been used for a number of years to make diamond or diamond-like coatings (see, e.g., A. Feldman et al. "Chemical Vapor Deposited Diamond," pp. 413–436 in *Ceramic Films and Coatings*, ed. by J. B. Wachtman and R. A. Haber (Noyes, Park Ridge, N.J., 1993)). These coatings have found use in cutting tools for machining aluminum and other ductile nonferrous alloys, plastics, and abrasive composite materials (see, e.g., R. A. Hay, "The New Diamond Technology and its Application in Cutting Tools," pp. 305–327 in *Ceramic Cutting Tools*, ed. by E. D. Whitney (Noyes, Park Ridge, N.J., 1994)).

It is known that cobalt interferes with adhesion of WC—Co inserts and many techniques have been devised to try and improve the adhesion of diamond to cemented carbides (see U.S. Pat. No. 5,236,740 to Peters et al. (Aug. 17, 1993) which teaches a method for increasing the surface roughness to improve adhesion via chemical etching, U.S. Pat. No. 5,433,977 which teaches deposition of a refractory intermediate layer to enhance adhesion, and U.S. Pat. No. 5,370,944 which teaches introducing a surface-modified layer containing no binder phase).

Silicon nitride and SiAlON ceramics have coefficients of thermal expansion ranging from $2.8 \times 10^{-6}/°C$. to $3.7 \times 10^{-6}/°C$., having a good match with diamond at $\approx 3.2 \times 10^{-6}/°C$. Such tools have little residual stress in the coatings. The reported fracture toughness of a polycrystalline coarse-grained diamond CVD coating is $5.3 \pm 11.3$ MPa$\sqrt{m}$ at room temperature (see Drory, et al., "Fracture Toughness of Chemically Vapor-Deposited Diamond," *J. Am. Ceram. Soc.*, 74[12] 3148–50 (1991)). Typical silicon nitride and SiAlON substrates range in toughness between 4 and 6 MPa$\sqrt{m}$. These materials have low apparent toughness compared to tools with residual compressive stresses.

Tungsten carbide 6 wt. % Co substrates have a coefficient of thermal expansion of $\approx 5 \times 10^{-6}/°C$. and can therefore be used to put the diamond coating in compression. Unfortunately, the poor adhesion at the interface limits these coatings thicknesses, such that either it is impractical to deposit thick coatings due to slow deposition rates or the coatings spall off due to the high residual stresses at the weakly bonded interfaces. The toughness of WC—Co substrates are typically on the order of 8 MPa$\sqrt{m}$.

Binderless WC has been used for machining titanium with some success (see U.S. Pat. No. 4,828,584 to Cutler (May 9, 1989)). Cutler teaches how to select a grain growth inhibitor to limit grain size. U.S. Pat. No. 5,089,447 to Timm et al. (Feb. 18, 1992)) used $W_2C$ as an additive in order to control grain size and make high hardness, fine-grained materials. These materials have toughness values near 4 MPa$\sqrt{m}$. U.S. Pat. No. 5,372,797 to Dunmead et al. (Dec. 13, 1994) relates to a method for making submicron WC such that very fine-grained materials can be made using this technology. While high hardness appears to be advantageous in water jet cutting, it is not requisite for a substrate since the diamond has higher hardness than the finest WC or WC-based composite. Accordingly, fine-grained WC materials are not currently believed to be used as substrate materials due to their low fracture toughness.

It has been demonstrated that compressive surface stresses can be used to improve performance when loading is concentrated at the surface which is under surface compression (see Chao et al., "Rolling-Contact Fatigue and Wear of CVD-SiC with Residual Surface Compression," *J. Am. Ceram. Soc.*, 78[9] 2307–13 (1995)). Furthermore, recent calculations and experiments show that the apparent toughness of cracks extending through the layer under surface compression can result in higher values of apparent toughness than that of the monolithic materials (see Lakshminarayanan, et al. "Toughening of Layered Ceramic Composites with Residual Surface Compression," *J. Am. Ceram. Soc.*, 79[1] 79–87 (1996)). Peak apparent toughness values on the order of 30 MPa$\sqrt{m}$ were obtained for $Al_2O_3$-15 vol. % $ZrO_2$ composites with surface compression on the order of 400 MPa, whereas the intrinsic toughness of the material is on the order of 5–7 MPa$\sqrt{m}$.

It would be an improvement in the art to have a ceramic or ceramic metal (i.e., cermet) component with a thicker and more adherent diamond coating so as to have improved wear life and increased manufacturing flexibility (e.g. a thicker diamond coating could be pre-ground and shaped more easily than a thinner diamond coating).

DISCLOSURE OF THE INVENTION

The invention includes cutting, milling, drilling, punching, and other tools and wear parts which have a polycrystalline diamond coating which coats a medium to coarse-grained, polycrystalline, tungsten carbide (WC), which may in turn be co-sintered to an aluminum oxide-tungsten carbide composite core, such that the tools and wear parts have high (>8 MPa$\sqrt{m}$) apparent toughness. Generally, the substrates of this invention contain no metal additions, except for possible contamination (e.g. contamination introduced by milling with WC—Co media in a stainless steel container), and can be made without any metallic impurities using a liquid phase to densify the WC. For example, $Y_2O_3$—$Al_2O_3$ can be used as an additive to densify the WC, thereby introducing no cobalt, iron, or chromium into the composition. The surface of the substrate can be roughened either mechanically or chemically, but the resulting surface is essentially greater than 95% of theoretical density, with all grains having an average size of less than about 15 $\mu$m, with an average grain size being preferably between about 1 and 10 $\mu$m, with a grain size of 2–5 $\mu$m being particularly useful.

When added compressive stress in the substrate is desired, e.g. for interrupted cutting or more aggressive drilling and milling operations, then a layered ceramic substrate is made where the inner layer is comprised of WC—$Al_2O_3$ and the outer layers include WC such that the thickness of the outer layers are $\approx \frac{1}{10}$ the total thickness of the component, and the residual compressive stress in the outer layers is greater than 100 MPa, preferably between 200 and 1000 MPa (the balancing tensile stress in the inner layer is between 40 and 200 MPa).

The thickness of the diamond coating can be tailored to specific applications. When thin diamond coatings (<30 μm) are desired, the substrate should have high apparent toughness in the absence of the coating. Such a substrate should have an outer layer of WC which is at least 100 μm thick and is preferably between 200 and 300 μm thick, and is under a compressive stress of at least 100 MPa and preferably between 200 and 1000 MPa. When thicker diamond coatings (>30 μm) are desired, the substrate may or may not have residual compressive stresses. For diamond coatings of 100 μm or thicker, WC is the preferred substrate.

The invention also includes methods of making tools according to the invention which involves first forming a green body (i.e., unsintered body) in either a monolithic (WC) or three-layer (WC/WC—Al$_2$O$_3$/WC) geometry with a green density greater than 40% of theoretical (and preferably greater than 55%), and then sintering at a time and temperature sufficient to densify the ceramic into a body with greater than 95% density. The toughness of WC substrates without intentionally introduced residual stress should be greater than 5 MPa√m and three-layer composites with residual stresses greater than 100 MPa will have an apparent toughness of the substrate dependent on crack length, with toughness increasing with crack length as the crack grows towards the WC/WC—Al$_2$O$_3$ interface. The diamond coating may be applied by chemical vapor deposition or physical vapor deposition (preferably chemical vapor deposition) at a rate of preferably greater than one (1) micron ("μm") per hour, and preferably greater than five (5) μm per hour. The diamond coating preferably consists of dense, polycrystalline diamond grains which are less than twenty-five (25) μm in diameter and preferably less than five (5) μm in diameter. Other diamond-like coating and equivalent materials may alternatively be used with the invention.

The present invention increases the toughness or the apparent toughness of binderless WC substrates used in diamond coating. The invention also includes methods of making tough WC substrates. Furthermore, it is desired to coat substrates which are already under high residual compression such that crack initiation does not occur at the diamond/ceramic interface. The invention also includes methods of making binderless WC coated materials which have improved adhesion compared with WC—Co substrates or modified WC—Co substrates.

The present invention can be used to make diamond coated ceramic (or ceramic-metal (cermet)) substrates which can be used in cutting, milling, drilling, punching, and other applications requiring high wear, erosion, and abrasion. In a preferred embodiment, the present invention allows the beneficial aspects of polycrystalline diamond tools to be applied to a wide variety of net-shaped applications where vapor deposition permits complex parts to be manufactured.

BEST MODE OF THE INVENTION

In WC—Co materials, a trade-off exists between hardness and toughness, which is related to the grain size of the WC (see Almond, "Deformation characteristics and Mechanical Properties of Hard Materials," pp. 517–61 in *Science of Hard Materials* (Plenum Press, NY 1983)). Because of the excellent wetting characteristics of the Co-based binder phase on WC grains, it is thought that the toughness is dependent on the mean-free path (thickness of Co) of binder, with larger grains having a higher mean free path and therefore, longer binder ligaments which must be broken in order to propagate cracks.

Figure 1:
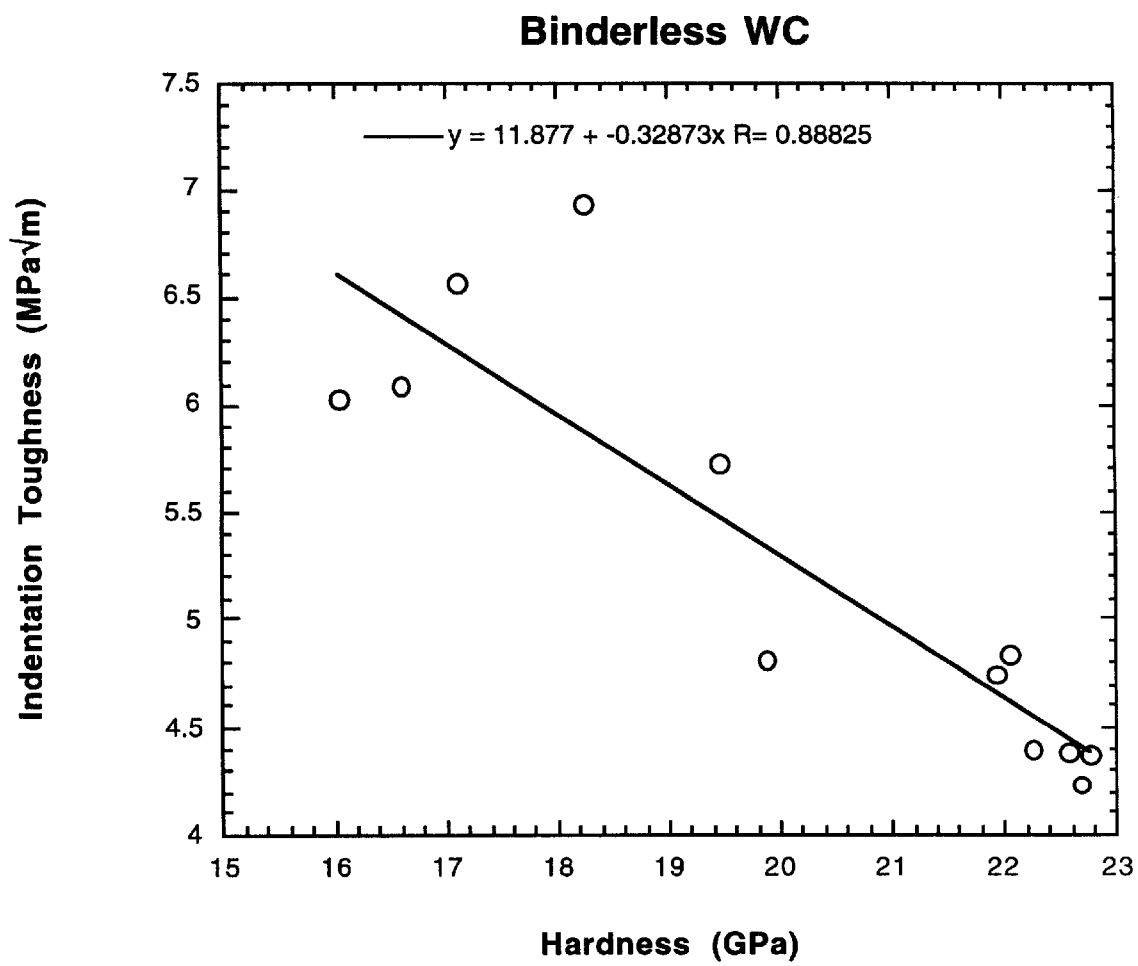
FIG. 1 is a graph depicting the hardness-toughness trade-off in binderless tungsten carbide.
Figure 2:
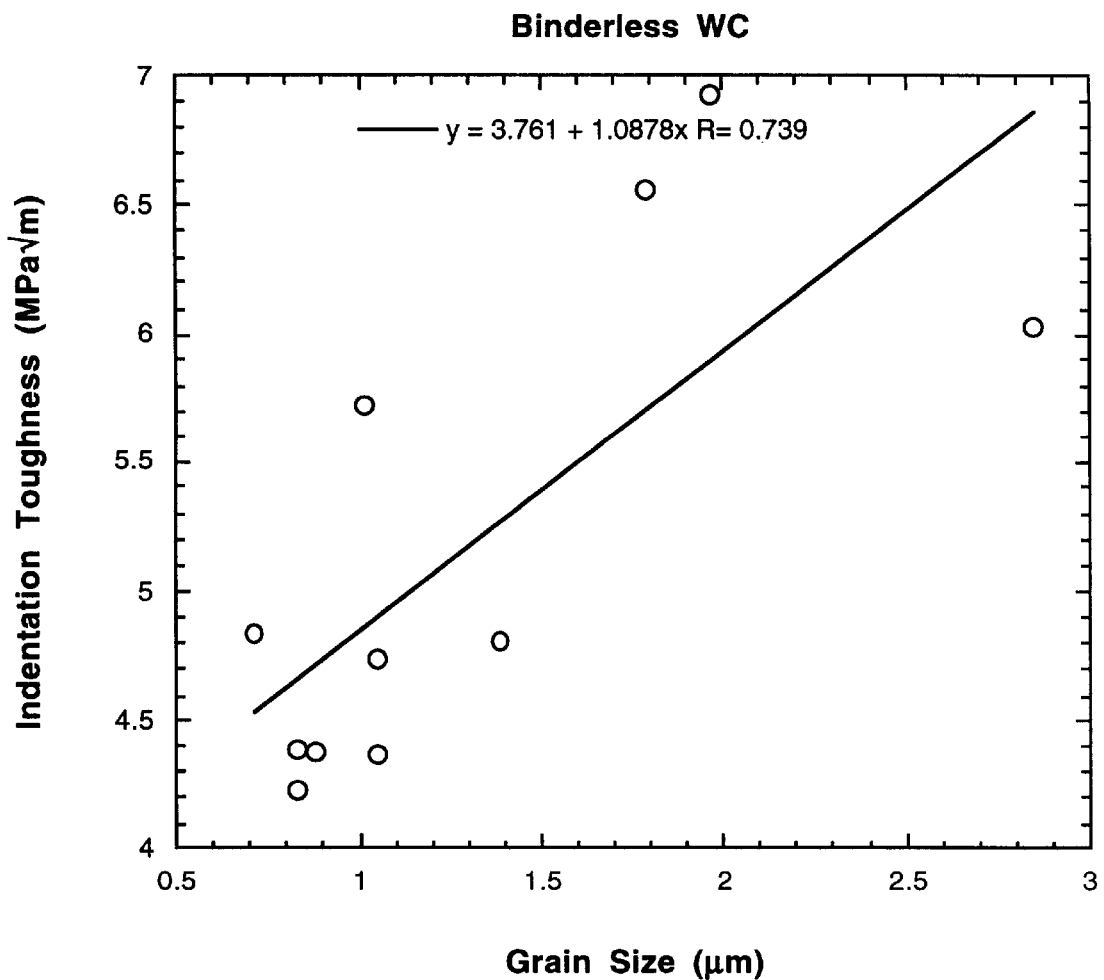
FIG. 2 is a graph depicting the effect of grain size in binderless tungsten carbide on toughness.

FIG. 1 shows that the same toughness/hardness trade-off occurs for binderless WC, and FIG. 2 shows the relationship between toughness and grain size for binderless WC. Because surface roughness is a function of grain size, it is an advantage to have a coarse-grained WC substrate for diamond coating. The combination of no metallic catalyst to aid in the conversion of diamond to graphite (which results in weak bonding) and the increased surface roughness (which allows for increased mechanical interlocking) makes medium to coarse-grained WC a very substantial improvement in the art as compared to fine-grained WC.

While submicron WC can be coated and the back conversion of diamond to graphite is greatly aided by the absence of cobalt, the fine grain size limits mechanical interlocking. Furthermore, these substrates have low toughness compared to WC—Co and cannot tolerate high applied stress. In contrast, the toughness of medium to coarse-grained binderless WC are 25 to 50% higher than fine-grained WC and therefore crack propagation is more difficult. This allows WC with grain sizes in the 1–10 μm range to be used in much more aggressive applications because of the higher base toughness of the polycrystalline WC. In addition, the higher surface roughness allows for better mechanical interlocking.

The surface roughness can be increased by mechanical treatments (e.g. grinding which results in grain pull-out), chemical treatments (e.g. etching which attacks grain boundaries), or mixtures of such treatments. One can also heat treat the mechanically and/or chemically roughened surfaces by heating to high temperatures (≈1500° C.) in order to improve the bonding of grains in the attacked area at the surface of the substrate by solid state diffusion. Furthermore, this high temperature process removes impurities introduced during grinding (coolant additives) or etching (surface groups). The preferred average grain size is of the order of 2–5 μm. Grain size is determined by etching polished surfaces with Murakami's reagent and measuring grains using the line intercept method (see E. E. Underwood, *Quantitative Stereology* (Addison-Wesley 1970)). Coarser-grained materials (>10 μm average grain size) can be used, but their lower strength mitigates against their use in applications where high applied loads are encountered.

Tungsten carbide has a thermal expansion coefficient of ≈4.2×10$^{-6}$/°C. and cobalt has a thermal expansion of 12.2×10$^{-6}$/°C. While removing the Co from WC—Co materials lower the toughness, it has the positive advantage of limiting the catalysis of the diamond to graphite reaction and lowers the thermal expansion mismatch S between the CVD diamond and the substrate. Assuming a biaxial stress state and looking at a sandwich structure in which CVD diamond is only on the top and bottom surfaces, the residual compressive stress in the coating, $\sigma_c$, is given by:

$$\sigma_c = (\Delta T \Delta \alpha E_s E_c t_s)/(2E_c t_c (1-\upsilon_c) + E_s t_s (1-\upsilon_s))$$

wherein ΔT is the temperature range over which stresses are set up, Δα is the mismatch in thermal expansion between coating and substrate, E is Young's modulus, t is thickness, υ is Poisson's ratio, and the subscripts c and s refer to the coating and substrate, respectively. The residual tensile stress in the substrate, $\sigma_s$, is given by:

$$\sigma_s = -2t_c\sigma_c/t_s$$

Assuming $\Delta T = 900°$ C., $\Delta\alpha = 1\times10^{-6}/°$C., $t_c = 30$ μm, $t_s = 9.5$ mm, $E_c = 1000$ GPa, $E_s = 650$ GPa, and $\upsilon_c = \upsilon_s = 0.2$, compressive stress in the coating is calculated to be 1115 MPa and the corresponding tensile stress in the substrate is 7 MPa. This calculation shows that high compressive stresses develop in the coating. It is generally thought that high residual compression in the coating aids in debonding and should therefore be minimized (see, e.g. U.S. Pat. No. 4,990,403 to Ito). The present invention desires to have high residual compression in order to have high apparent toughness which is likely to be beneficial in applications where the loading is from the surface (e.g., cutting and abrasion applications).

In most cutting, milling, drilling, and wear applications, the load is highest at or near the surface of the tool. Surface compressive stresses are most effective when the applied stress is highest at the outer surface of the tool and the thickness of the layer under surface compression is at least two to three times the critical flaw size in the material. Experience with oxide coatings (see Cutler et al. "Strength Improvement in Transformation-Toughened Alumina by Selective Phase Transformation," *J. Am. Ceram. Soc.*, 70[10] 713–18 (1987)) suggests that a coating thickness of at least 100 μm is desired. The problem with thin coatings is that crack initiation occurs at the interface or slightly within the substrate where there is no superimposed residual compressive stress. One desires a very strong substrate, similar in strength to that of WC—Co. Because WC has lower strength than WC—Co, surface compressive stresses are used to superimpose a compressive stress near the outside of the component in order to counteract the applied tensile stress. Thicker diamond coatings result in lower compressive stress in the coating, but also result in superimposed compressive stresses over a larger region of the tool.

Higher diamond deposition rates should be possible without cobalt since it will be possible to deposit the diamond at higher temperatures. Faster diamond deposition is important in order to economically produce components with thicker coatings. Diamond coatings with thicknesses of 100–200 μm are desired but may be unrealistic. In order to circumvent this problem, the present invention uses compressive stresses to limit crack propagation by introducing compressive stresses in the substrate prior to coating.

One way to introduce compressive stresses in the substrate is by making a layered ceramic in the green state (see U.S. Pat. No. 4,656,071 to Virkar). This can be accomplished with WC by making a layered structure with WC on the outer layers and a core of WC—$Al_2O_3$. The thermal expansion of WC—$Al_2O_3$ composites increases linearly with increasing $Al_2O_3$ content. WC and $Al_2O_3$ are non-reactive and sinter at approximately the same temperature. The desired thermal expansion mismatch can be obtained by choosing the appropriate amount of alumina to add. The main advantage of using alumina to control thermal expansion, is the ease with which sintering occurs, since no applied pressure is required in order to reach closed porosity. Other materials could be used, it is only important that the outer layers (material in contact with diamond where cutting will occur) should be medium to coarse-grained WC (2–5 μm) and the inner layer should have high strength such that crack initiation does not occur from the interface or slightly inside the interface. The amount of alumina which appears to give the best results is between five (5) and twenty-five (25) volume percent, with the thickness of the outer layer between ⅓ and 1/20 the total thickness of the tool, and preferably between ⅙ and 1/12th the total thickness of the tool.

Individual powder blends (e.g. WC and WC-10 vol. % $Al_2O_3$) are prepared separately and then the layered composites are processed in the green state by tape casting, powder pressing, co-extrusion, slip casting, gel casting, injection molding, or other methods for forming ceramics. The thickness of the WC outer layer in the sintered component is controlled in the green state. The green body is then sintered with or without applied pressure. When sintering without applied pressure, it is often advantageous to hot isostatically press ("HIP") to increase strength by minimizing the critical flaw size. Sintering environments are typically Ar or He, although $N_2$, vacuum, and $H_2$ can also be used. Sintering temperatures range from 1500° C. to 1900° C. with sintering between 1600° C. and 1800° C. preferred. Sintering times range typically on the order of thirty (30) minutes to two (2) hours. The most important part of sintering is to get to the state of closed porosity. Hot isostatic pressing occurs at temperatures from 1400 to 1700° C., with typical temperatures between 1500 and 1600° C. Isostatic pressure is typically between about 100 and 200 MPa, with Ar typically used as the pressure transmitting medium.

The resulting substrate has high apparent toughness near the outer region, limiting crack propagation. In fact, the apparent toughness increases with increasing crack length until the WC/WC—$Al_2O_3$ interface is reached. Apparent toughness values are on the same order of magnitude or greater than those for the toughness values of WC—Co substrates. The main advantage of these substrates is that they contain no cobalt and therefore have improved bonding to the diamond coating than WC—Co substrates of comparable toughness. The high apparent toughness of the binderless WC-based composites makes them excellent for cutting, milling, drilling or other wear applications requiring damage tolerance. The coating thickness can be thin (e.g. <30 μm) for substrates which have a high apparent toughness prior to coating, but it is still desired to have a thicker coating (>30 μm and preferably between 50 and 100 μm) in order to have less residual compressive stress in the coating. The desired compressive stress in the outer layers of the coating is at least 100 MPa and preferably between 300 and 600 MPa. This can be measured using any common residual stress technique (x-ray, interferometry, Raman spectroscopy, etc.) but the preferred technique is a simple strain gage method, as taught by Virkar, et al. *J. Am. Ceram. Soc.,* 71[3] C-148-C-151 (1988), where a strain gage is attached to one side of the three-layered composite and the strain is monitored as the opposite side is removed by incremental grinding. The desired residual stress in all diamond coatings of the present invention is greater than 500 MPa and preferably between 500 and 2000 MPa when measured by techniques.

The thickness of the diamond coating can be tailored to a specific application. When thin diamond coatings (e.g. <30 μm) are desired, the substrate should have high apparent thoughness in the absence of the coating. Such a substrate should have an outer layer of WC which is at least 100 μm thick, preferably between 200 and 300 μm thick, and be under a compressive stress of at least 100 MPa (preferably between 200 and 1000 MPa). When thicker diamond coatings (>30 μm) are desired, the substrate may or may not have residual compressive stresses. For diamond coatings of 100 μm or thicker, WC is the presently preferred substrate.

A preferred method of making the tools of the invention involves forming a green body (i.e., unsintered body) in either a monolithic (WC) or three-layer (WC/WC—Al$_2$O$_3$/WC) geometry with a green density greater than 40% of theoretical (and preferably greater than 55%) and sintering at a time and temperature sufficinet to densify the ceramic into a body with greater than 95% density. The toughness of WC substrates without intentionally introduced residual stress should be greater than 5 MPa√m and three-layer composites with residual stresses greater than 100 MPa will have an apparent toughness of the substrate dependent on crack length, with toughness increasing with crack length to the interface between the WC and WC—Al$_2$O$_3$. The diamond coating is applied by chemical vapor deposition or physical vapor deposition (preferably chemical vapor deposition) at a rate of preferably greater than 1 μm/hr and preferably greater than 5 μm/hr. The diamond coating consists of dense, polycrystalline diamond grains which are less than 25 μm in diameter and preferably less than 5 μm in diameter.

In an alternative embodiment, one applies a physical or chemical vapor deposition of WC or a material with a close thermal expansion to WC such as W$_2$C, SiC, or MO$_2$C, to a tough substrate (i.e., WC—Co, TiC—Ni—Mo, Al$_2$O$_3$—W, etc.) and thereby achieves enhanced adherence. The important point is that when diamond or diamond-like materials are deposited on WC or materials similar to WC they adhere much better than they do to WC—Co or other such materials which have metals present such that they promote the back-conversion of diamond to graphite.

In such an embodiment, a diamond-coated ceramic or ceramic-metal (cermet) component with high apparent toughness includes: a substrate chosen from the group of consisting of ceramics and cermets, the substrate, under a balancing residual tensile stress, characterized in having a fracture toughness of greater than 8 MPa√m; a diamond coating (e.g. >30 μm in thickness) covers the substrate, the diamond coating under a surface compressive stress of greater than 500 MPa at the surface, as determined by x-ray diffraction at room temperature; and a ceramic layer, interposed between said substrate and said diamond coating. Such a diamond-coated component is preferably manufactured by a process wherein the coating is applied by physical or chemical vapor deposition techniques and has a thickness or at least 1 μm.

The layer interposed between the substrate and diamond coating has a thermal expansion coefficient of about 3.0× 10$^{-6}$/°C. to about 6.0×10$^{-6}$/°C., and the substrate preferably has a fracture toughness greater than 8 MPa√m and a thermal expansion from about 3.0×10$^{-6}$/°C. to about 6.0× 10$^{-6}$/°C.

The following examples further illustrate the invention.

EXAMPLE 1

(Coarse-grained WC Suitable for Substrates)

A suitable substrate for diamond coating of binderless WC was prepared by adding 800 g WC (Type IV from Teledyne Wah Chang of Huntsville, Alabama) with a starting particle size of 15 μm (as measured by Fisher Sub-Sieve Sizer) to 1000 ml n-hexane and 2500 g WC—Co balls in a 15 cm diameter stainless steel ball mill. The mill was rotated at 75 rpm for 24 hours with a measured weight loss of 22.5 g WC—Co from the media. This treatment resulted in 0.16 wt. % (0.28 vol. %) Co in the powder. Two wt. % paraffin was added as a pressing aid, and the powder was dried in a rotary evaporator before screening −40 mesh. The screened powder was pressed at 35 MPa uniaxial pressure, followed by 200 MPa isostatic pressure. The pressed parts were delubed in hydrogen by heating at ≈100° C./hr to 400° C. and cooling to room temperature. The green density was 9.6 g/cc or 61% of theoretical. The parts were sintered in 1 L/min flowing Ar inside a graphite resistance heated furnace by heating at a rate of 500° C./hr to 1700° C. with a 30 minute hold (furnace cool to RT). The sintered SNR 420 inserts had a density of 15.14±0.04 g/cc or 97% of theoretical density with no open porosity. The parts were HIPed by heating in 90 minutes to 1600° C. and holding for 15 minutes in 200 MPa Ar overpressure. The HIPed densities were 15.36±0.03 g/cc. The parts were etched with Murakami's etchant and the average grain size measured by the line intercept method. The average grain size was 3.0 μm in diameter.

EXAMPLE 2

(Coarse-grained WC Processed in Water)

Seven kg WC (Type IV as in Example 1) was added to 2250 ml deionized water containing 17.5 g ammonium citrate and milled for 4 hours with ≈46.3 kg WC—Co media. A binder was added to the milled product and it was spray dried at an inlet temperature of 350° C. and an outlet temperature of 117° C. The spray dried powder was pressed and sintered, as in EXAMPLE 1 and had a density of 15.23±0.04 g/cc. The parts were HIPed, as described for EXAMPLE 1, and had a density of 15.50±0.02 g/cc. The Vicker's hardness was 16.2±0.32 GPa and the indentation toughness was 6.6±0.5 MPa/m. The average four point bend strength was 1080±57 MPa. The average grain size was 2.8 μm.

EXAMPLE 3

(Coarse-grained WC Processing Without Metallic Contamination)

Same as EXAMPLE 1, except that 5 vol. % Y$_2$O$_3$ and Al$_2$O$_3$ were added as sintering aids, and milling occurred in an urethane-lined mill. The material had similar properties to that in EXAMPLE 1 except no metallic impurities were introduced.

EXAMPLES 4–8

(Three-layer Substrates)

WC (Type O, from Teledyne Wah Chang Huntsville) with a starting particle size of 0.5 μm (as measured by Fisher Sub-Sieve Sizer) and Al$_2$O$_3$ (Alcoa A-16 S.G.) were added to 400 ml n-hexane and 2500 g WC—Co balls in a 15 cm diameter stainless steel ball mill. Theoretical densities of 15.7 and 3.98 g/cc were assumed for WC and Al$_2$O$_3$, respectively. Compositions containing 0, 12.5, and 25 vol. % alumina were prepared as in EXAMPLE 1. The Tubed and screened powders were used to make either monolithic or three-layer strength bars where the fine-grained WC/Al2O3 was used as the inner layer and the outer layers were made from the material described in EXAMPLE 1. Monolithic and layered composites were sintered as in EXAMPLE 1 with densities and strengths as shown in Table 1 below. EXAMPLEs 1, 4, 5, and 6 where monolithic (single composition) bars, whereas EXAMPLES 7 and 8 are three-layer bars. The three-layer bars were made by first putting ⅙th the total volume of powder using EXAMPLE 1 powder, and then adding ⅔rds the total volume of powder as either WC-12.5 vol. % $Al_2O_3$ (EXAMPLE 7) or 25 vol. % $Al_2O_3$ (EXAMPLE 8), and finally adding putting ⅙th the total volume of powder using EXAMPLE 1 powder. The powder was then compacted, as above, and fired along with the monolithic bars. All surface preparation was identical. As seen in Table 1, the three-layer bars have increased strength, as compared to the coarse WC of 130 MPa (EXAMPLE 7) or 285 MPa (EXAMPLE 8), in accord with expectation of increasing the residual stress in the outer layers.

TABLE 1

| Example | Composition | Description | Density (g/cc (% TD)) | Strength (MPa) |
|---|---|---|---|---|
| 1 | Coarse WC | Monolithic | 15.15 (96.6) | 671 ± 79 |
| 4 | Fine WC | Monolithic | 15.49 (98.7) | 1,085 ± 195 |
| 5 | Fine WC-12.5% $Al_2O_3$ | Monolithic | 14.09 (98.9) | 894 ± 237 |
| 6 | Fine WC-25% $Al_2O_3$ | Monolithic | 12.68 (99.3) | 884 ± 140 |
| 7 | EXAMPLES 1/5/1 | Three-layer | 14.34 (99) | 890 ± 133 |
| 8 | EXAMPLES 1/6/1 | Three-layer | 13.60 (98.9) | 939 ± 97 |

EXAMPLES 9–11

Twelve SNR 420 inserts of EXAMPLE 1 were ground into SPG 422 inserts. Three of the inserts were left untreated. Six inserts were etched for 10 minutes in concentrated nitric acid at 80° C. The etched inserts were then washed with deionized water and rinsed with acetone. Three of the etched inserts and three untreated inserts where heated to 1500° C. and held for 1 hour. The densities before and after etching are shown in Table 2. EXAMPLES 1, 9, 10, and 11 inserts were diamond coated to compare their adhesion relative to WC—Co inserts. The substrates were coated by a commercial vendor ($sp^3$ Inc., Mountain View, Calif.) using their standard operating conditions such that the thickness after coating was ≈30 μm. The inserts were then testing on 390 Al (slotted bar) at a speed of 1500 surface feet/minute, a feed rate of 0.005 inch/revolution, and a depth of cut of 0.025". All four conditions were adherent and lasted as long as their control sample (i.e., diamond-coated WC—Co). Chipping was noted, however, due to the lower toughness of the WC compared to WC—Co. When the control samples are coated for twice was long (i.e., a coating thickness of ≈60 μm) they spontaneously spall, due to a lack of adhesion. None of the four WC inserts spalled when coated at twice the thickness of diamond coating, showing the superior adhesion of the diamond coating on WC, as compared to WC—Co.

TABLE 2

| | | | Density (g/cc) | |
|---|---|---|---|---|
| Example | Composition | Treatment | Before | After |
| 1 | Coarse-grained WC | None | 15.62 ± 0.04 | 15.66 ± 0.03 |
| 9 | Coarse-grained WC | Chemical | 15.64 ± 0.08 | 15.66 ± 0.01 |
| 10 | Coarse-grained WC | Thermal | 15.64 ± 0.06 | 15.63 ± 0.03 |
| 11 | Coarse-grained WC | Chemical/Thermal | 15.63 ± 0.03 | 15.57 ± 0.03 |

The above examples are only illustrative to teach how to make suitable substrates for diamond coating such that the diamond coated substrates will have high adhesion and high apparent toughness. While the invention has been described in terms of several specific embodiments, it must be appreciated that other embodiments could readily be adapted by one skilled in the art. Accordingly, the scope of the invention is to be limited only by the following claims.

What is claimed is:

1. A ceramic component with high apparent toughness, said ceramic component comprising:
    a substrate consisting essentially of greater than 99 vol. % tungsten carbide and containing no more than 1 vol. % metallic impurities, said tungsten carbide having an average grain size of about 1 to about 10 μm, and, adhered thereto,
    a diamond coating, said diamond coating under a surface compressive stress of greater than 500 MPa at the surface, as determined by x-ray diffraction at room temperature.

2. The ceramic component of claim 1 wherein said diamond coating is greater than 30 μm in thickness.

3. The ceramic component of claim 1 wherein said diamond coating is greater than 100 μm in thickness.

4. The ceramic component of claim 1 wherein said tungsten carbide is present as 99% by volume and has an average grain size of about 2 to about 5 μm.

5. The ceramic component of claim 1 wherein said substrate has been chemically and/or thermally treated prior to adhering the diamond coating thereto.

6. A diamond-coated ceramic component with high apparent toughness, wherein the diamond coating is under a surface compressive stress of greater than 500 MPa at the surface, as determined by x-ray diffraction at room temperature, adhered to a substrate which consists of greater than 50 vol. % tungsten carbide and contains less than 1 vol. % metallic impurities, wherein the substrate consists of a layered or graded substrate such that the outer layer is a binderless tungsten carbide and the inner layer is a WC—$Al_2O_3$ composite containing from about 5 to about 50 volume % aluminum oxide, said layered composite being co-sintered such that the tungsten carbide layers have a residual compressive stress exceeding 100 MPa at room temperature prior to diamond coating.

7. The diamond-coated ceramic component of claim 6, wherein the substrate has an outer layer thickness of between about 200 and 300 μm, prior to diamond coating.

8. The diamond-coated ceramic component of claim 6, wherein the substrate has a compressive stress in the binderless tungsten carbide layer of between 200 and 1000 MPa prior to diamond coating.

9. A diamond-coated ceramic or ceramic-metal (cermet) component with high apparent toughness comprising:
    a substrate chosen from the group of substrates consisting of ceramics and cermets, the substrate, under a balancing residual tensile stress, characterized in having a fracture toughness of greater than 8 MPa√m;
    a diamond coating covering said substrate, said diamond coating under a surface compressive stress of greater than 500 MPa at the surface, as determined by x-ray diffraction at room temperature prior to diamond coating as determined by x-ray diffraction at room temperature; and
    a ceramic layer, interposed between said substrate and said diamond coating.

10. The diamond-coated component of claim 9 wherein the diamond coating is greater than 30 μm in thickness.

11. The diamond-coated component of claim 9 manufactured by a process wherein the diamond coating is applied by physical or chemical vapor deposition techniques and has a thickness of at least 1 μm.

12. The diamond-coated component of claim 9 wherein the ceramic layer interposed between said substrate and diamond coating has a thermal expansion coefficient of about $3.0 \times 10^{-6}$/°C. to about $6.0 \times 10^{-6}$/°C.

13. The diamond-coated component of claim 12 wherein the ceramic layer interposed between said substrate and diamond coating comprises WC.

14. The diamond-coated component of claim 12 wherein the ceramic layer interposed between said substrate and diamond coating comprises $W_2C$.

15. The diamond-coated component of claim 12 wherein the layer interposed between said substrate and diamond coating comprises SiC.

16. The diamond-coated component of claim 12 wherein the ceramic layer interposed between said substrate and coating comprises $Mo_2C$.

17. The diamond-coated component of claim 12 wherein the substrate is WC—Co.

18. The diamond-coated component of claim 12 wherein the substrate is TiC—$Mo_2C$—Ni.

19. The diamond-coated component of claim 12 wherein the substrate is $Al_2O_3$—W.

* * * * *

UNITED STATES PATENT AND TRADEMARK OFFICE
CERTIFICATE OF CORRECTION

PATENT NO. : 5,952,102
DATED : September 14, 1999
INVENTOR(S) : Raymond A. Cutler It is certified that error appears in the above-identified patent and that said Letters Patent is hereby corrected as shown below:

Column 1, line 47, change "5.3±11.3 MPa$\sqrt{m}$" to --5.3±1.3 MPa$\sqrt{m}$--;

Column 1, line 55, change "$5 \times 10^{-6}/°C$." to --$5 \times 10^{-6}/°C$--;

Column 4, line 51, change "$4.2 \times 10^{-6}/°C$." to --$4.2 \times 10^{-6}/°C$--;

Column 4, line 55, change "mismatch S between" to --mismatch between--;

Column 6, line 56, change "techniques." to --x-ray techniques.--;

Column 7, line 23, change "$MO_2C$," to --$Mo_2C$,--; and

Column 8, line 56, change "Tubed" to --lubed--.

Signed and Sealed this

Twentieth Day of June, 2000

*Attest:*

Q. TODD DICKINSON

*Attesting Officer*   *Director of Patents and Trademarks*